United States Patent [19]
Sutherland

[11] Patent Number: 5,861,762
[45] Date of Patent: Jan. 19, 1999

[54] INVERSE TOGGLE XOR AND XNOR CIRCUIT

[75] Inventor: Ivan E. Sutherland, Santa Monica, Calif.

[73] Assignee: Sun Microsystems, Inc., Mountain View, Calif.

[21] Appl. No.: 813,054

[22] Filed: Mar. 7, 1997

[51] Int. Cl.$^6$ ...................... H03K 19/21; H03K 19/0948
[52] U.S. Cl. .............................. 326/55; 326/121; 326/113
[58] Field of Search .................... 326/51, 52, 54, 326/113, 121, 112, 108, 55

[56] References Cited

U.S. PATENT DOCUMENTS

| | | | |
|---|---|---|---|
| 4,575,648 | 3/1986 | Lee | 326/54 |
| 4,621,338 | 11/1986 | Uhlenhoff . | |
| 4,749,887 | 6/1988 | Sanwo et al. | 326/54 |
| 5,442,801 | 8/1995 | Sato et al. | 326/52 |
| 5,568,067 | 10/1996 | McDermott et al. | 326/54 |
| 5,736,868 | 4/1998 | Kim et al. | 326/54 |

FOREIGN PATENT DOCUMENTS

| | | |
|---|---|---|
| 0 122 946 | 10/1984 | European Pat. Off. . |
| WO85/02957 | 7/1985 | WIPO . |

OTHER PUBLICATIONS

"High Performance Self–Reset CMOS TXOR and CXOR Circuits," IBM Technical Disclosure Bulletin, 37:271–72 (Jul. 1994).

Dearden et al., "Four–Device Exclusive Or CMOS Circuit," IBM Technical Disclosure Bulletin, 25:2375–76 (Oct. 1982).

Dearden et al., "Eight–Device Exclusive Or CMOS Circuit," IBM Technical Disclosure Bulletin, 25: 2377–79 (Oct. 1982).

Laurence F. Wood, "High Performance Analysis and Control of Complex Systems Using Dynamically Reconfigurable Silicon and Optical Fiber Memory," IEEE Workshop on FPGAs for Custom Computing Machines, IEEE Computer Society Press (Apr. 5–7, 1993), pp. 132–141.

*Primary Examiner*—Jon Santamauro
*Assistant Examiner*—Don Phu Le
*Attorney, Agent, or Firm*—Finnegan, Henderson, Farabow, Garrett & Dunner, L.L.P.

[57] ABSTRACT

A four transistor XOR or XNOR gate includes an inverting stage and a non-inverting stage. The transistors in each stage are coupled so as to enable changing inputs and existing inputs to drive the output in the same direction. The XOR gate and XNOR gate take advantage of a known order or inputs to reduce the delay of the gate.

13 Claims, 13 Drawing Sheets

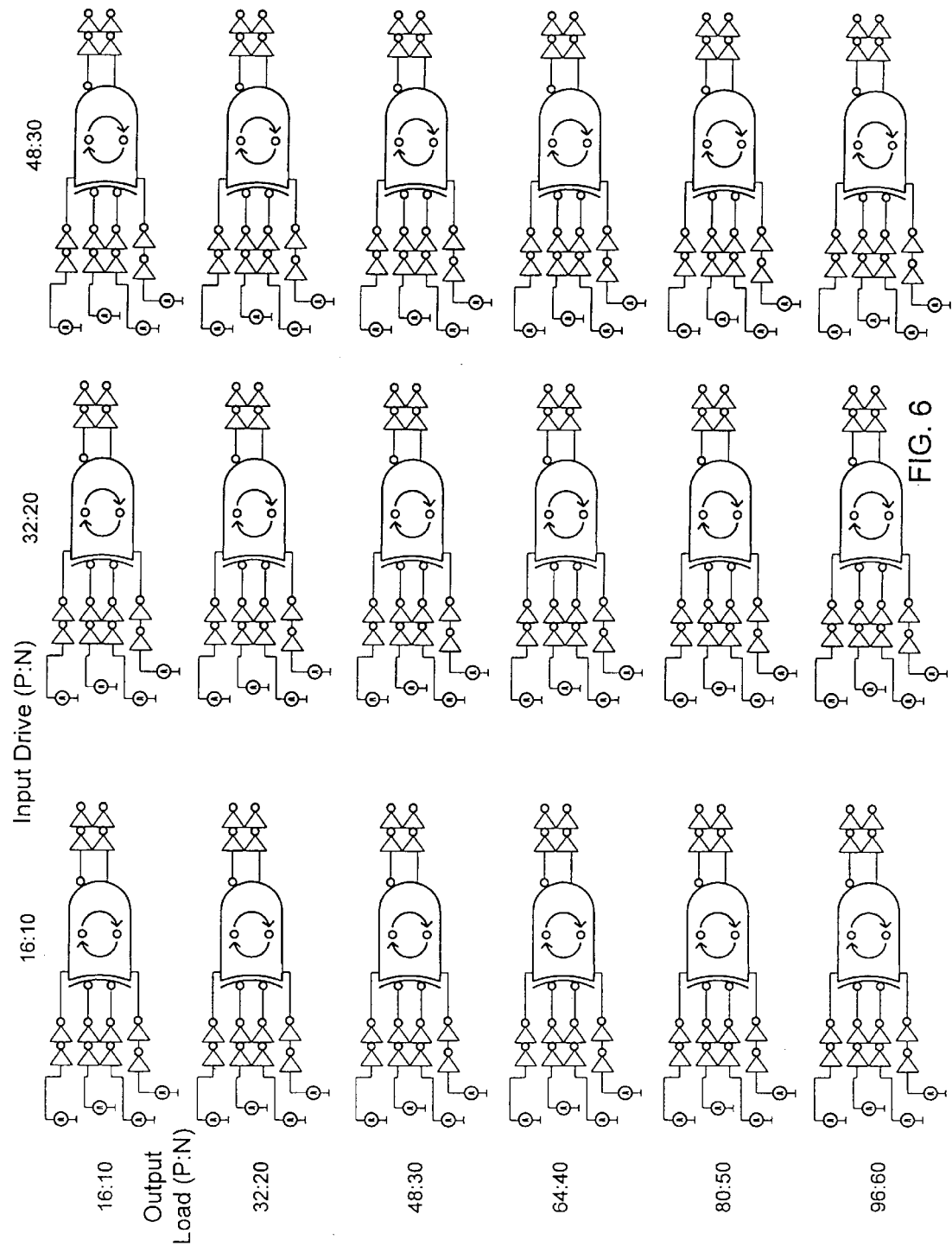

INVERSE TOGGLE XOR AND XNOR CIRCUIT

BACKGROUND OF THE INVENTION

The present invention relates generally to the field of logic elements, and more particularly to the field of exclusive OR and exclusive NOR logic elements having alternating inputs.

FIG. 1A shows a conventional exclusive OR (XOR) circuit 100. The circuit includes eight transistors 105, 110, 115, 120, 125, 130, 135, and 140, four input signals A, B, and their corresponding inverted signals, ⌐A and ⌐B, and an output signal, OUT. The "⌐" signal indicates an inverse operation. Two of the transistors, 105 and 125, are coupled to voltage line Vdd, and two transistors, 120 and 140, are coupled to ground line Gnd.

The eight transistors in XOR gate 100 typically occupy a large area. This, of course, reduces the number of circuits that can be placed on a single chip and increases production costs.

Some attempts have been made to improve this problem. FIG. 1B shows a conventional XOR/exclusive NOR (XNOR) gate 170 in differential form. Gate 170 includes twelve transistors, all of the transistors of gate 100 plus four more transistors, 145, 150, 155, and 160. The gate also produces another output signal, ⌐OUT. By using the differential form, gate 170 takes advantage of the overlapping use of the transistors coupled to Vdd and Gnd to reduce the number of transistors for both gates from sixteen (eight plus eight) to twelve. Gate 170, however, still occupies a large area.

Conventional XOR and XNOR circuits have other limitations. By coupling transistors directly to Vdd and Gnd to produce output levels, both XOR gate 100 and XOR/XNOR gate 170 suffer from poor transition responses. For each gate, either the Vdd line or Gnd line drives the output. When an input changes, the transistors that are conducting turn off to remove the conduction from the line currently driving the output. Other transistors, corresponding to the input transition, turn on to supply the conduction from the other line to drive the output. The transistors turning off, however, drain current from the output, thereby increasing delay. For both gates, the early part of the transition is wasted waiting for the gates of the turning on transistors to surpass the threshold. This waiting reduces the performance of the circuits.

SUMMARY OF THE INVENTION

In accordance with the present invention, a logic gate has been designed to optimize performance for situations where the order of inputs and which input will change first is known and transitions or events at the inputs alternate. The logic gate takes advantages of knowing the order of transitions to reduce the number of transistors and the amount of delay for XOR and XNOR gates. In an apparatus according to the present invention, four transistors are arranged and coupled to produce logical outputs without Vdd or Gnd lines.

The following description, as well as the practice of the invention, set forth and suggest additional advantages and purposes of this invention. The elements and combinations set forth in the claims achieve these advantages and purposes.

To obtain the advantages and in accordance with the purpose of the invention, as embodied and broadly described herein, a logic gate for producing an output logic signal representing a logical operation of a first logic signal and a second logic signal includes first, second, third, and fourth input terminals receiving, respectively, the first logic signal, the second logic signal, a first inverted logic signal representing the logical inverse of the first logic signal, and second inverted logic signal representing the logical inverse of the second logic signal; a non-inverting stage; an inverting stage; and an output terminal. The non-inverting stage includes a first transistor of a first type having its channel coupled at a first end to the first input terminal and having its gate coupled to the fourth input terminal, and a second transistor of a second type, different from the first type, having its channel coupled between a second end of the channel of the first transistor and the second input terminal and having its gate coupled to the first input terminal. The inverting stage includes a third transistor of a first type having its channel coupled at a first end to the third input terminal and having its gate coupled to the second input terminal, and a fourth transistor of a second type having its channel coupled between a second end of the channel of the third transistor and the fourth input terminal and having its gate coupled to the third input terminal. The output terminal is coupled to the junction of the channels of the first transistor and the second transistor and to the junction of the channels of the third transistor and fourth transistor to provide the output logic signal.

Where the first and third transistors are N-type transistors, and the second and fourth transistors are P-type transistors, the output logic signal represents an exclusive OR operation of the first and second logic signals. Where the first and third transistors are P-type transistors, and the second and fourth transistors are N-type transistors, the output logic signal represents an exclusive NOR operation of the first and second logic signals.

Both the foregoing general description and the following detailed description provide examples and explanations only. They do not restrict the claimed invention.

DESCRIPTION OF THE DRAWINGS

The accompanying drawings, which are incorporated in and constitute a part of this specification, illustrate embodiments of the invention and, together with the description, explain the advantages and principles of the invention. In the drawings.

FIG. 6 is a block diagram of an array of different drives and different loads connected to a circuit according to the present invention.

DESCRIPTION OF THE PREFERRED EMBODIMENT

Figure 1A:
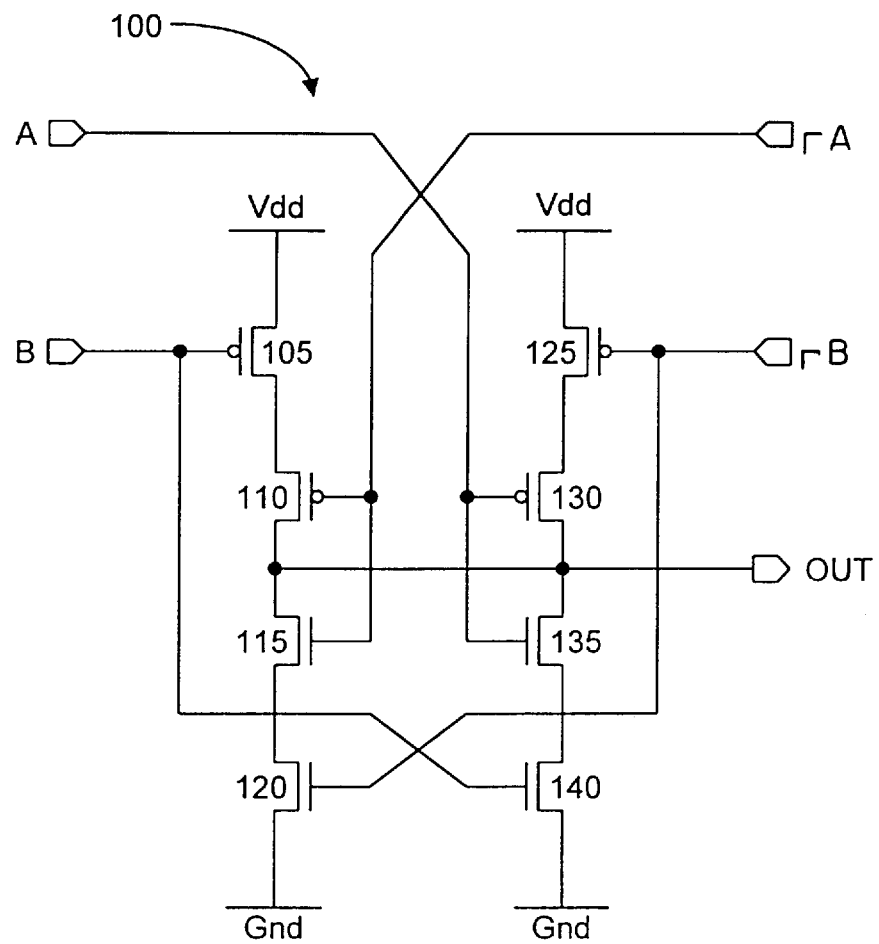
FIG. 1A is a circuit diagram of a conventional XOR gate.

Reference will now be made to various embodiments according to this invention, examples of which are shown in the accompanying drawings and will be obvious from the description of the invention. In the drawings, the same reference numbers represent the same or similar elements in the different drawings whenever possible.

This invention relates to a logic gate called an Inverse Toggle. A Toggle circuit, which relates to the Inverse Toggle as described more completely herein, has a single input and two outputs. A transition or event at the input causes a transition or event at one of the two outputs, and a subsequent event at the input causes an event at the other output. All succeeding events at the input alternately cause events at the two outputs. The result is that events at the input of the Toggle cause events at the outputs to alternate in a known order.

The logic gate in accordance with the present invention, on the other hand, takes advantage of situations where the order of inputs to a circuit is known and the input events alternate. Therefore this logic gate, which provides XOR and XNOR functionality, is called an "Inverse Toggle". Designing a circuit to take advantage of known input behavior permits certain efficiencies and, in this invention, results in a faster circuit with fewer transistors than conventional XOR and XNOR circuits. Several circuits, such as event control logic, have inputs that behave in this manner and thus can benefit from the Inverse Toggle.

Figure 2:
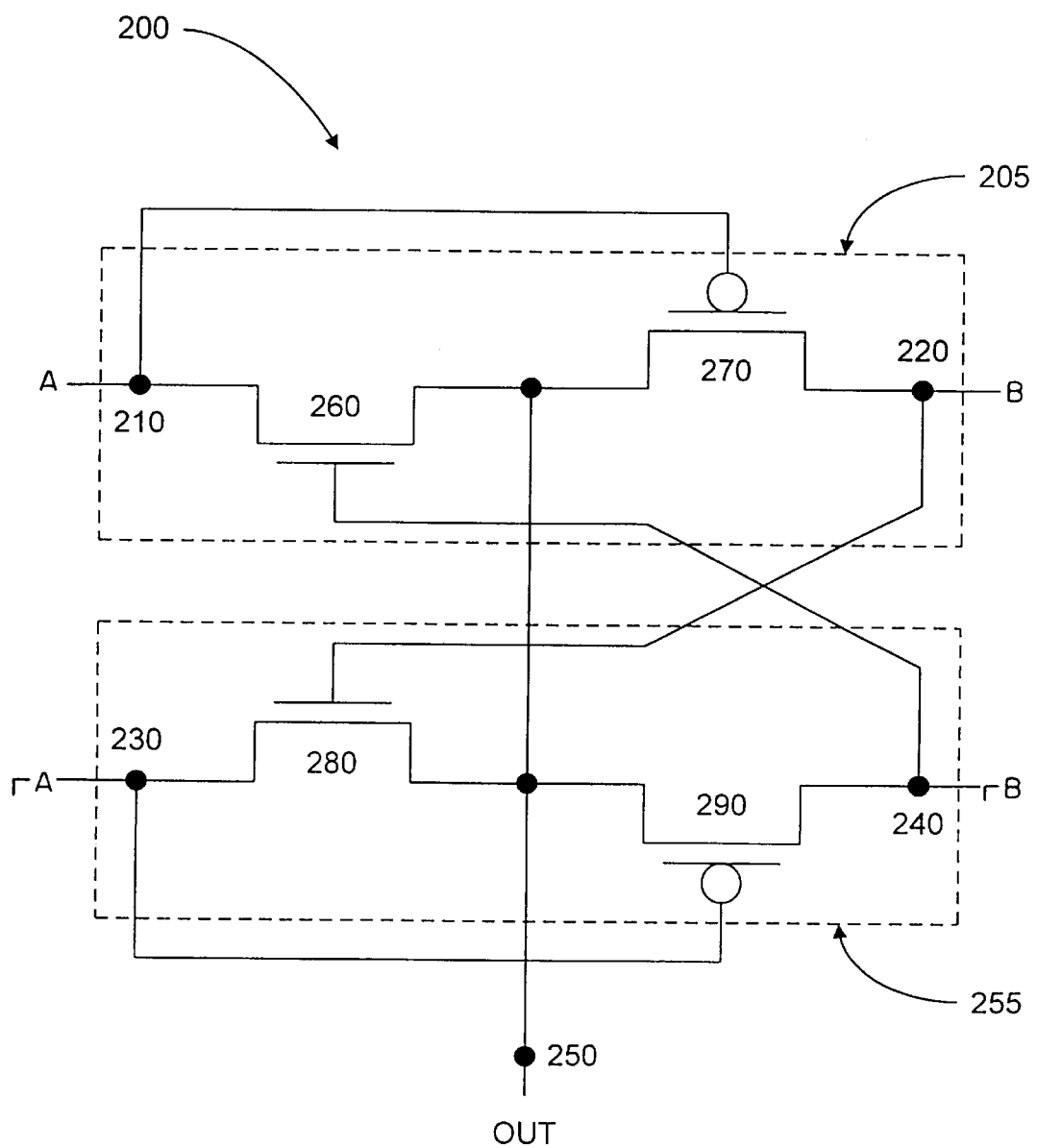
FIGS. 2 is a circuit diagram for an XOR gate according to the present invention.

FIG. 2 is a circuit diagram of an XOR gate 200 operating as an Inverse Toggle in accordance with this invention. XOR gate 200 includes a non-inverting stage 205 and an inverting stage 255. Non-inverting stage 205 includes an N-type transistor 260 and a P-type transistor 270, as well as input terminals 210 and 220. Similarly, inverting stage 255 comprises an N-type transistor 280, a P-type transistor 290, and input terminals 230 and 240. XOR gate 200 also includes an output terminal 250.

In non-inverting stage 205, terminal 210 is coupled to one end of the channel of transistor 260, and terminal 240 is coupled to its gate. Transistor 270 has its channel coupled between terminal 220 and the other end of the channel of transistor 260, and has its gate coupled to terminal 210.

In inverting stage 255, terminal 230 is coupled to one end of the channel of transistor 280, and terminal 220 is coupled to its gate. Transistor 290 has its channel coupled between terminal 240 and the other end of the channel of transistor 290, and its gate coupled to terminal 230.

Output terminal 250 is coupled to both non-inverting stage 205 and inverting stage 255. In non-inverting stage 205, output terminal 250 is coupled to the junction of the channels of transistors 260 and 270. Likewise, output terminal 250 is coupled to the junction of the channels of transistors 280 and 290 of inverting stage 255.

Figure 3:
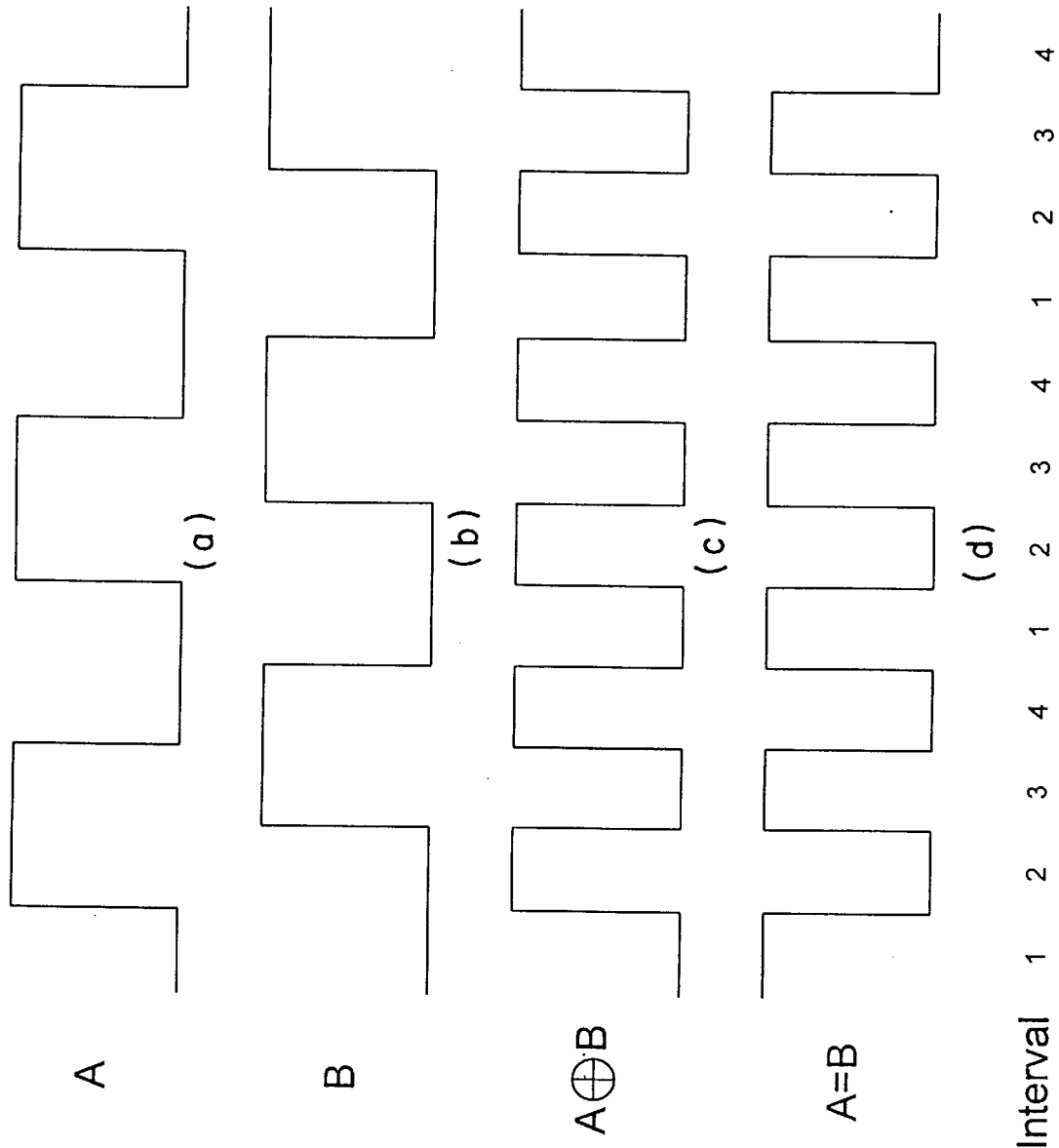
FIG. 3 is a timing diagram for input transitions to the XOR gate of FIG. 2.

Gate 200 operates efficiently when signals A and B alternately change, representing perhaps alternating events, and Gate 200 acts as an Inverse Toggle. FIG. 3 shows an example of this type of alternating transitions of A and B, hereinafter referred to as forward operation.

In operation, input terminals 210, 220, 230, and 240 of XOR gate 200 receive input logic signals A, B, ┌A, and ┌B, respectively. In addition, output terminal 250 of XOR gate 200 produces output logic signal OUT.

FIG. 3(a) shows the state transition for input A, FIG. 3(b) shows the state transition for input B, and FIG. 3(c) shows the transitions in the output, A⊕B at the output of XOR gate 200. Initially, when both A and B are low (logical 0), the output for gate 200 is low. When A becomes high, the output for gate 200 becomes high.

Gate 200 derives its speed from the complementary nature of the N-type and P-type transistors. N-type transistors conduct when their gates receive a high logic signal and their source/drain receive a low logic signal. P-type transistors conduct when their gates receive a low logic signal and their source/drain receive a high signal. Therefore, when conducting, N-type transistors pass a low signal and P-type transistors pass a high signal, and they both act as pass transistors. When fully conducting, a transistor acts as a pass transistor since a signal passes from one end of its channel to the other.

Applying the input logic signals shown in FIG. 3 to gate 200 demonstrates how the gate takes advantage of the complementary operation of the N-type and P-type transistors to reduce delay. Initially, only N-type transistor 260 is conducting because ┌B is high and A and B are both low. P-type transistor 270 does not conduct, even though its gate is low, because its source/drain path is also low. N-type transistor 280 does not conduct because its gate is low, and P-type transistor 290 does not conduct because its gate is high. Transistor 260 conducts a low logic signal to output terminal 250, indicating the appropriate false condition (logical 0) because A and B are equal.

As A begins to change from a low to high state, output terminal 250 draws current from the changing input A, driving terminal 250 high through pass transistor 260 which is still fully conducting. Because transistor 260 is an N-type transistor, however, it cannot pull the output 250 all the way high because that will begin to turn transistor 260 off.

Midway through the transition, however, both transistors 260 and 290 are partially conducting. P-type transistor 290 starts to conduct because its gate is coupled to terminal 230 where ┌A is going low, and its channel is coupled to terminal 240 where ┌B remains high. Because transistor 290 conducts a high signal, partially conducting transistor 290 also drives the output high. Thus, the partially conducting transistors 260 and 290 are driving OUT in the same direction.

Towards the end of the transition, transistor 260 shuts off and transistor 290 takes over to drive OUT 250 fully high drawing current from input ┌B. Using input ┌B to drive the output will make the input droop slightly, but still drive OUT fully high. Once fully conducting, transistor 290 will become a pass transistor.

Figure 1B:
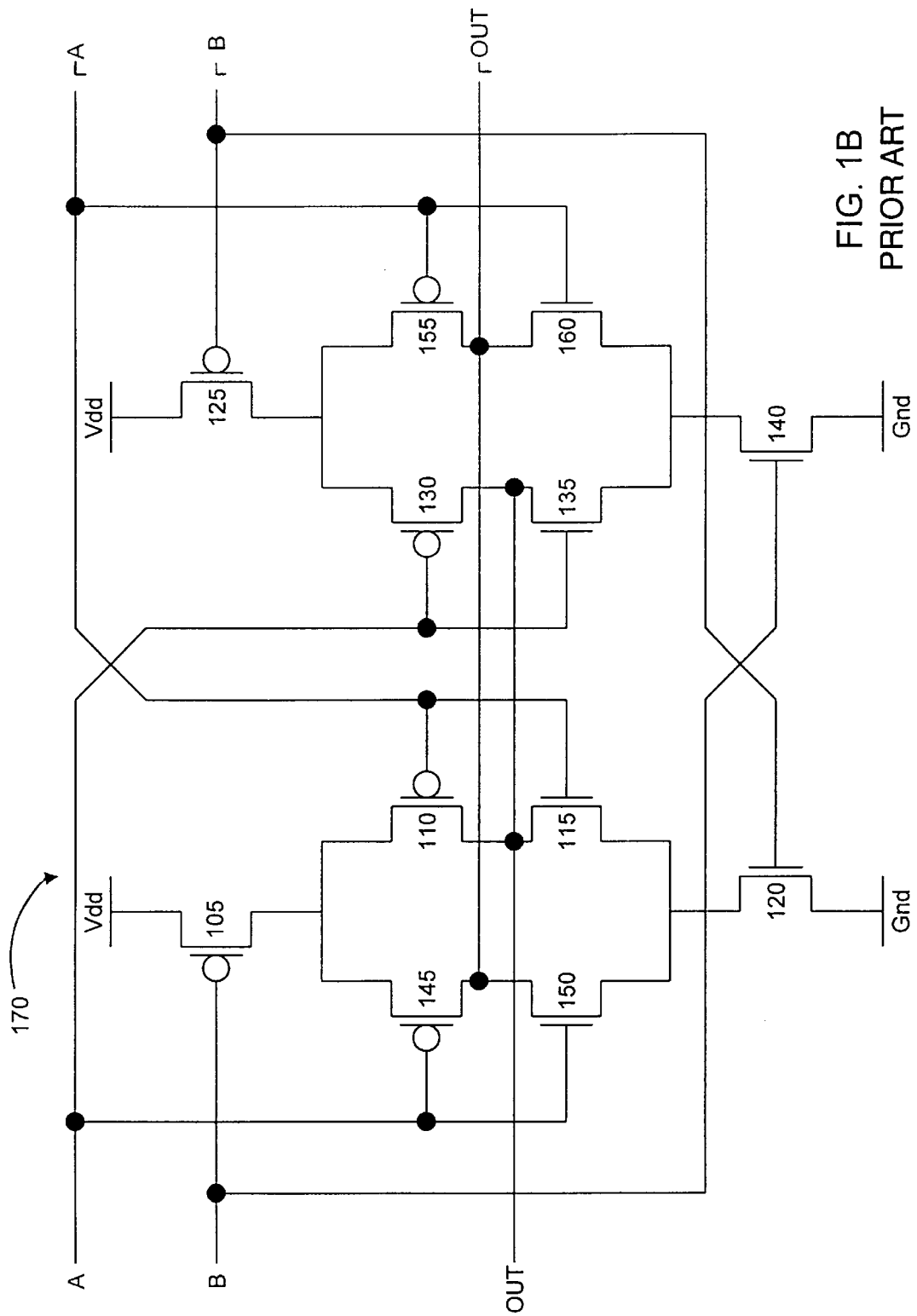
FIG. 1B is a circuit diagram for a conventional XOR/XNOR gate in differential form.

Simulations, some of which are shown below, demonstrate that XOR gate 200 is faster than conventional XOR gates. The improved speed of the circuit and its reduced delay come as a consequence of the combined effects of the transistor 260 driving the output high during the initial part of the transition, and transistor 290 driving OUT the rest of the way high during the latter part of the transition. Both transistors drive the output in the same direction. In contrast, the conventional XOR circuit 100 (FIG. 1) uses the Vdd and Gnd lines to drive the output. During a transition, the transistors enabling one line to drive the output (e.g. Vdd) turn off, while transistors enabling the other line to drive the output (e.g. Gnd) turn on. Unlike the Inverse Toggle design of the present invention, however, the transistors turning off also drain current from the output, thereby slowing the circuit.

Another difference between gate 200 and conventional XOR circuit 100 is how early the pass transistor contribution affects the output. For gate 200, the pass transistor, such as transistor 260 in the example above, begins contributing almost immediately. As soon as the input starts changing, the output also starts changing. For the conventional XOR circuit 100, the early part of the transition is wasted waiting for the gates of the transistors turning on to surpass the threshold. On the other hand, XOR gate 200 has its pass transistor contributing to the output even while the inverter transistor (i.e. because it is inverting the output), such as transistor 290 in the example above, is still below threshold.

Figure 4:
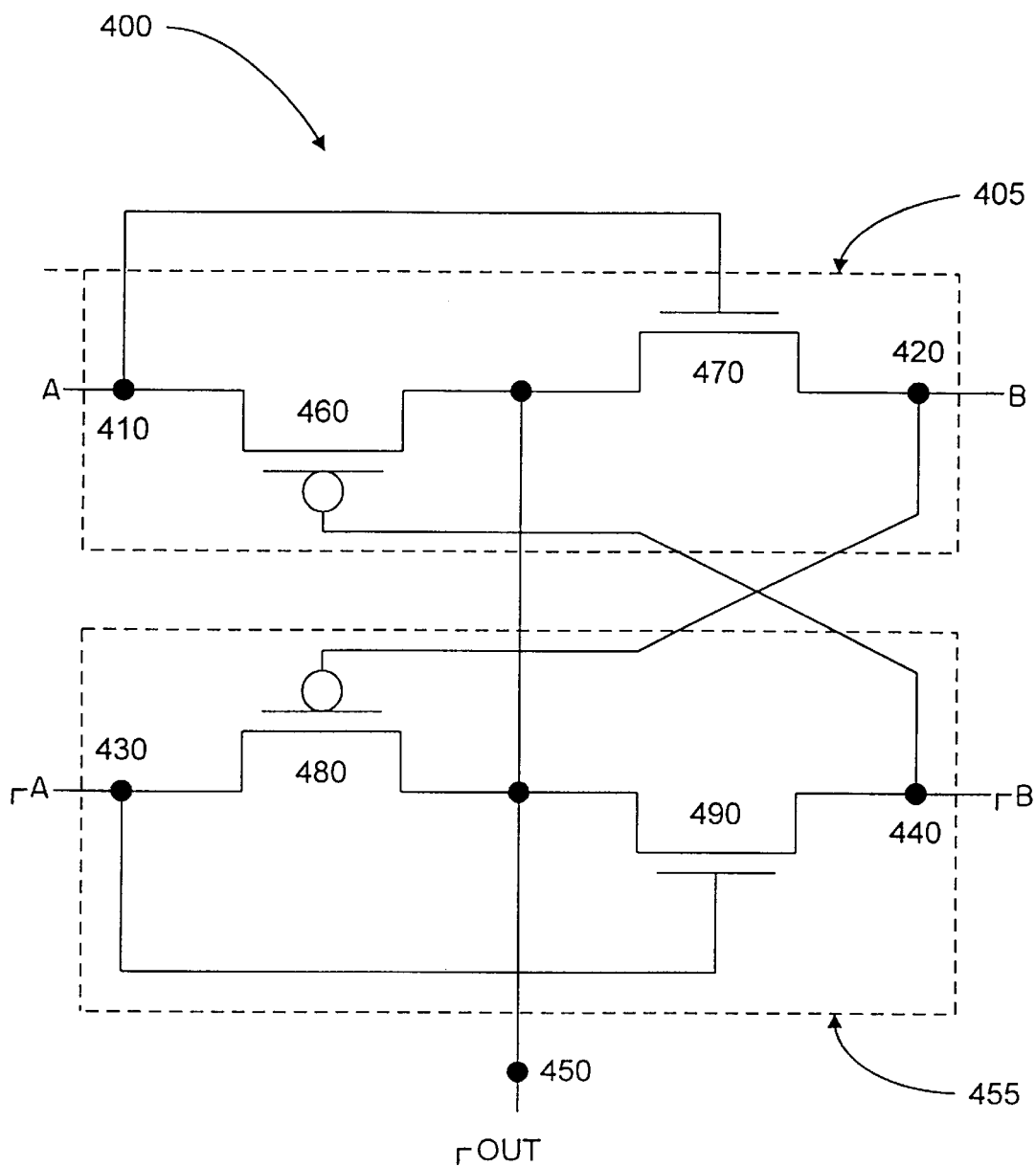
FIG. 4 is a circuit diagram for an XNOR gate according to the present invention.

FIG. 4 is a circuit diagram of XNOR gate 400 in accordance with this invention. XNOR gate 400 is identical to XOR gate 200 except that the transistor types of each stage are reversed. In FIG. 4, the non-inverting stage 405 includes a P-type transistor 460, an N-type transistor 470, and input terminals 410 and 420. The inverting stage 455 comprises a P-type transistor 480 and N-type transistor 490, in addition to input terminals 430 and 440. XNOR gate 400 also includes an output terminal 450. Each of the elements of XNOR gate 400 are connected in the same fashion as the elements of XOR gate 200.

FIG. 3(d) shows the transitions for the output, A=B at the output 450 of XNOR gate 400. As shown in FIG. 3(d), the output goes low when A changes, and goes high when B changes. XNOR gate 400 operates in the same fashion as XOR gate 200 described above.

Figure 5:
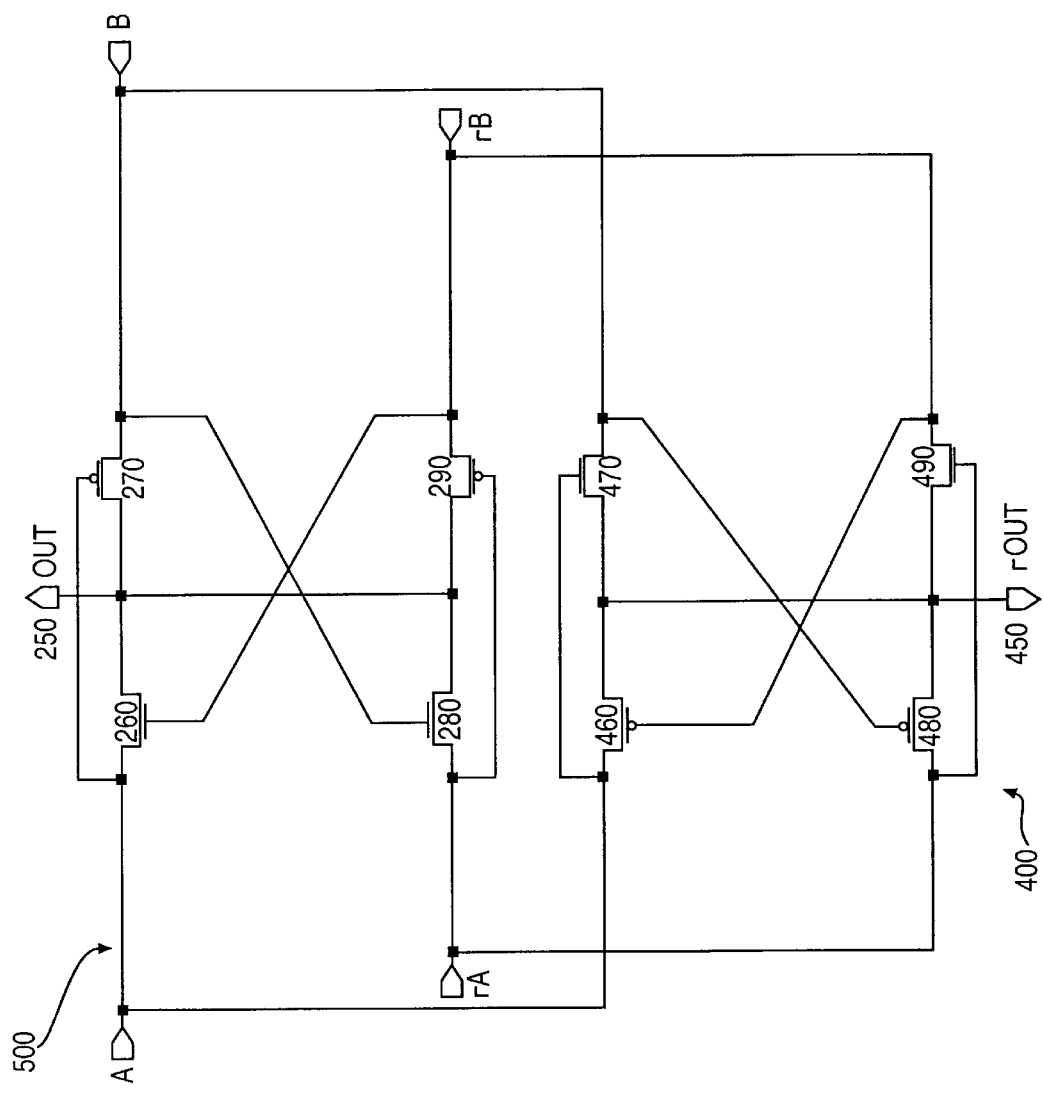
FIG. 5 is a circuit diagram for an XOR gate and XNOR gate according to the present invention combined into a single circuit.

FIG. 5 represents a single circuit 500 combining both XOR gate 200 and XNOR gate 400. The circuits share input terminals. In the circuit of FIG. 5, gate 500 includes XOR gate 200. Transistors 260, 270, 280, and 290 of gate 500 correspond directly to the transistors of XOR gate 200 of FIG. 2. Output terminal 530 providing the output logic signal OUT also corresponds to output terminal 250 of gate 200. Transistors 460, 470, 480, and 490 of gate 500 parallel the transistors of XNOR gate 400. Output terminal 560 providing the output logic signal ⌐OUT also corresponds with output terminal 450 of gate 400. The operation of the circuit 500 is exactly the same as the operation of each of the individual gates 200 and 400.

Circuit 500 is also faster than circuit 170 in FIG. 2, as simulation has shown. The simulation requires a fair comparison of intrinsic and incremental delays. Conventional logic circuits inherently suffer from two types of delays, intrinsic and incremental delay. Intrinsic delay represents the delay a logic circuit exhibits when no load is applied to it. Incremental delay represents the increased delay from each additional unit load added to a circuit. A unit load, which depends on the size of the transistors used in the logic circuit, often represents the load of an inverter. In light of the foregoing, there is a need for an XOR gate or XNOR gate to reduce delays and operate more quickly than conventional circuits with as few transistors as possible.

To determine the incremental delay, the unit loading must be the same load that the circuit presents at one of its logical inputs. Assuming the source capacitance is about equal to the gate capacitance, a unit load for the Inverse Toggle would be 2N+2P, where N and P are the widths of the transistors in the Inverse Toggle.

Table 1 shows a comparison of the delays of gate 500 and conventional gate 170. The delays for the Inverse Toggle are shown as a range because they depend on the drive that is given.

TABLE 1

Comparison of Delays

| Input | Intrinsic Delay (ps) | Incremental Delay (ps) |
|---|---|---|
| XOR gate 170 input A | 101 | 97 |
| XOR gate 170 input B | 207 | 87 |
| Gate 500 Forward Operation | 20–27 | 40–50 |
| Gate 500 Backward Operation | 76–104 | 40–102 |

The delay values given in Table 1 clearly demonstrate the improvement provided by the Inverse Toggle. During forward operation, the Inverse Toggle has substantially lower delays than the conventional circuits. Even during backward operation, the inverse toggle produces lower delays. Backward or reverse operation occurs when the sequence of transitions are reversed (where output goes low when A changes and output goes high when B changes in gate 200). Although gates 200 and 400 produce correct outputs during backward operation, the Inverse Toggle performance degrades in comparison to forward operation.

FIG. 6 shows an array of different drives and different loads connected to the circuit 500 shown. The transistor gate widths in microns are (P:N)=16:10 for the left column, 32:20 for the center column, and 48:30 for the right column. These sizes refer to the second driver in the string where the drivers are the elements coupling the inputs to the gate. The first driver is 16:10 in each case.

Each row represents a different output loading: 16:10 for the top row to 96:60 for the bottom row in increments of 16:10. The load size corresponds to the first load inverter in the string where the load inverters are the elements coupled to the outputs of the gate. The second inverter is always four times as big as the first.

For the purpose of simulating the circuit, smaller and larger input drives are tested along with smaller and larger output loads, as shown in FIG. 6. As might be expected, the larger the input drive, the faster the circuit operates. Conversely, the larger the output load, the slower the circuit operates. The proof of the input drive and output load effects is shown below.

Figure 7A:
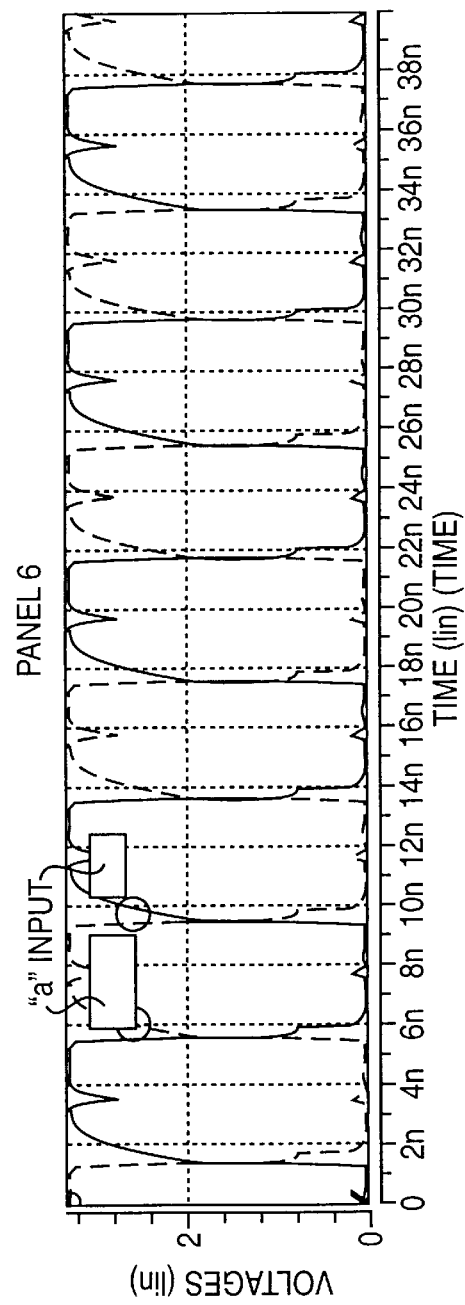
FIG. 7 is a diagram of simulated wave forms of signals input to and output from the circuit of FIG. 5 to measure delay.
Figure 7B:
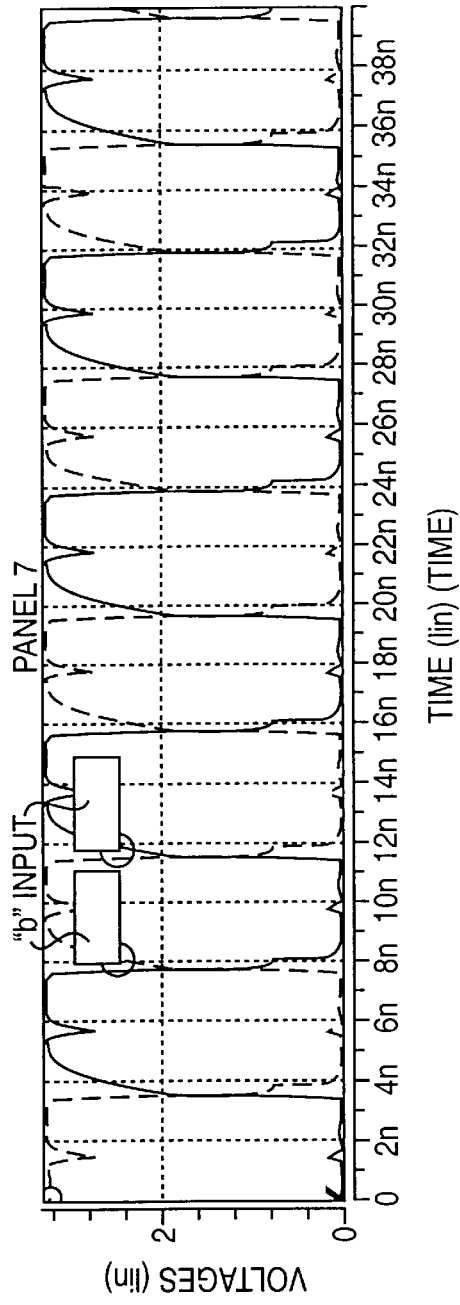
Figure 7C:
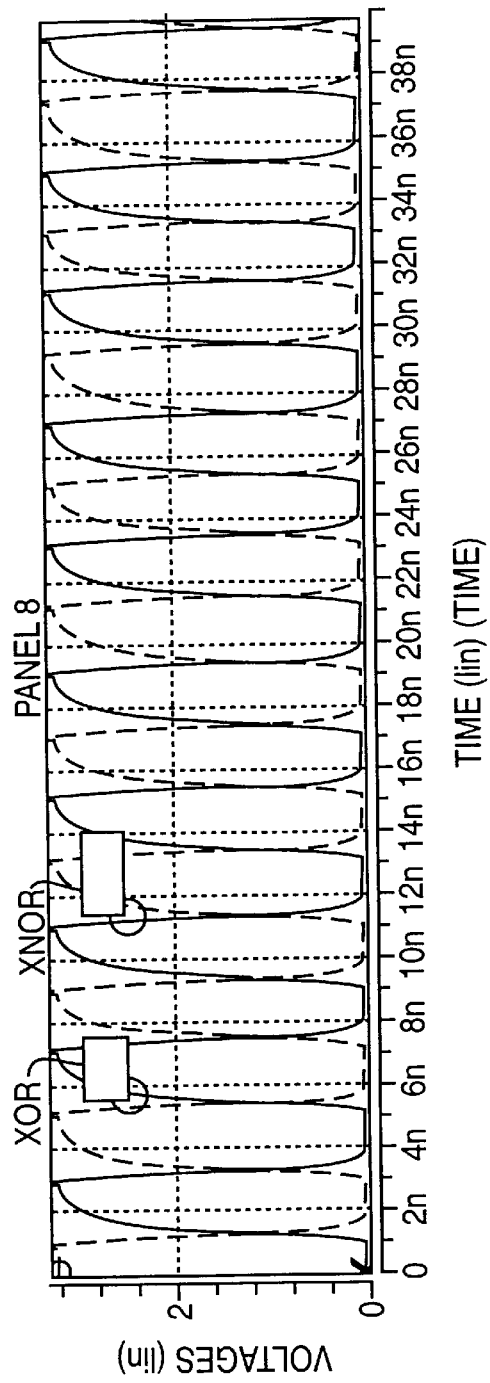

FIG. 7 shows the simulated waveforms for each of the input logic signals and output logic signals. The top trace, 7a, represents the values for the input logic signals A and ⌐A superimposed. The middle trace, 7b, represents the values of the input logic signals B and ⌐B superimposed. The bottom trace, 7c, shows the XOR and XNOR outputs plotted together. The waveforms determine the delay measurements based on the time difference between the input signal crossing and the output signal crossing.

The notch in the first and second waveforms occurs when the gate 200 draws current from an otherwise stable input. The depth of the notch depends on the strength of the driving circuit. A larger driving circuit produces a smaller notch. The notch in the waveforms occurs because the inputs driving the output are not as stiff as the conventional gate 170 driven by Vdd and Gnd lines, because they cannot supply the same amount of current as the Vdd and Gnd lines.

In addition to the notch when an input signal is high, a low input driving the output low after a transition also has a notch caused by the output changing from high to low. In other words, the not-yet-low output causes the input signal to supply current to the output even though the input signal is low. The current supplied to the output causes the voltage of the input signal to have a small notch.

Table 2 is a chart of the delay times in picoseconds for the forward operation of the Inverse Toggle for particular simulated transistors.

TABLE 2

Delay times for the Inverse Toggle logic gates: Forward Operation

| Load | Input Drive (P:N) = 8:5 | (P:N) = 16:10 | (P:N) = 32:20 | (P:N) = 48:30 | (P:N) = 64:40 |
| --- | --- | --- | --- | --- | --- |
| 0 u (Extrapolated) | 27 | 26.5 | 25 | 21 | 19.5 |
| 26 u | 70 | 56.5 | 47.5 | 41.5 | 39 |
| 52 u | 111.5 | 86.5 | 71 | 62 | 60 |
| 78 u | 154 | 117 | 94 | 83.5 | 80 |
| 104 u | 196 | 149.5 | 116 | 103 | 98.5 |
| 130 u | 240.5 | 181 | 139 | 123.5 | 117 |
| 156 u | 284.5 | 211 | 159.5 | 143.5 | 138 |

Figure 8:
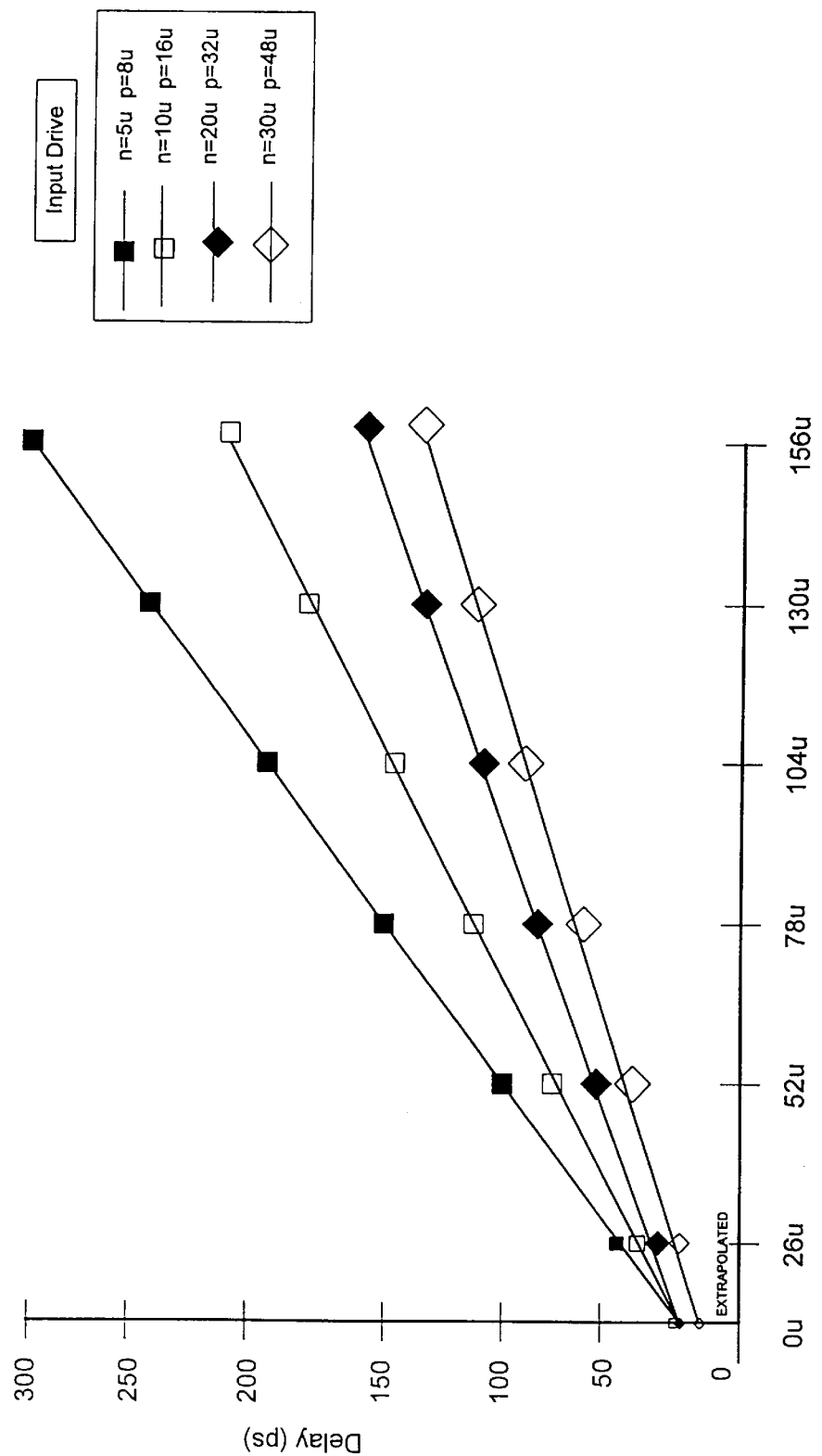
FIG. 8 is a graph showing the delays during forward operation of the circuit of FIG. 5.

FIG. 8 shows a plot of the values from Table 2. The vertical axis represents the delay from input to output, and the horizontal axis represents output loading. Each curve shows the delay for the same Inverse Toggle with 16:10 size transistors, but with different size drivers. The plot shows that the bigger drivers cause less delay. The curves get closer together as the drivers get bigger, however, suggesting a diminishing advantage from bigger drivers beyond drivers about twice as large as the base circuit.

To determine the intrinsic delay, the curves are extrapolated to no load which yielded a delay of about 30 ps. The incremental delay of the circuit is the increase in delay for each additional unit load added to the circuit. Based on a unit load of a 32:20 inverter, the incremental delays are between 40 and 50 ps depending on the particular input drive condition.

Table 3 is a chart of the delay times in picoseconds for the backward or reverse operation of the Inverse Toggle. Although the backward operation causes greater delays, the XOR and XNOR gates still produce a correct value output.

TABLE 3

Delay times for the Inverse Toggle logic gates: Backward Operation

| Load | Input Drive (P:N) = 8:5 | (P:N) = 16:10 | (P:N) = 32:20 | (P:N) = 48:30 | (P:N) = 64:40 |
| --- | --- | --- | --- | --- | --- |
| 0 u (Extrapolated) | 104 | 82 | 70 | 72 | 75.5 |
| 26 u | 155 | 114.5 | 9394 | 93 | 95.5 |
| 52 u | 206 | 146.5 | 117.5 | 114.5 | 115 |
| 78 u | 257.5 | 176 | 141 | 134.5 | 134.5 |
| 104 u | 307.5 | 211 | 164 | 155 | 155 |
| 130 u | 357 | 245.5 | 189.5 | 175.5 | 174.5 |
| 156 u | 411 | 277 | 214 | 199 | 195.5 |

Figure 9:
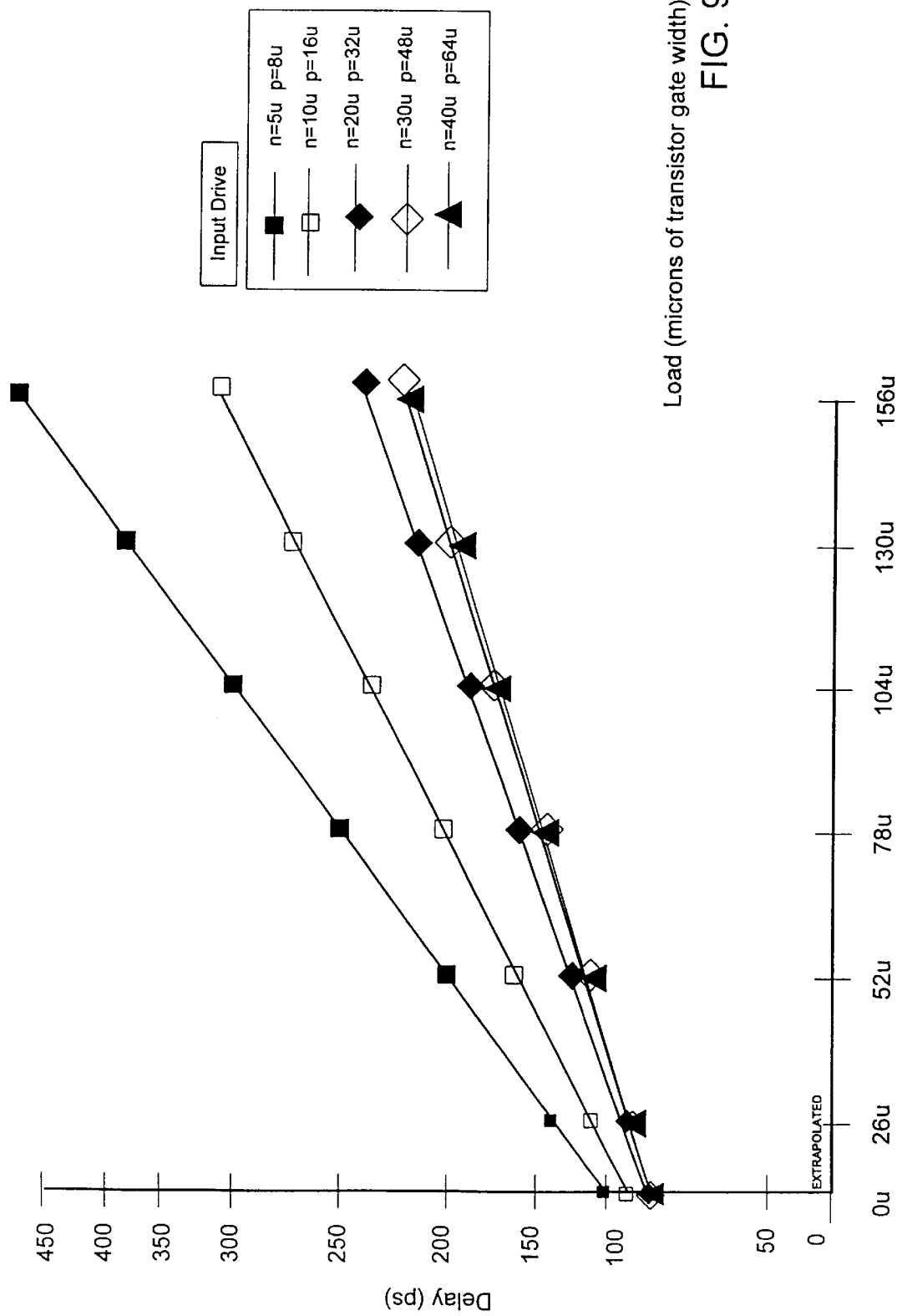
FIG. 9 is a graph showing the delays during reverse operation of the circuit of FIG. 5.

FIG. 9 shows plots of values from Table 3, similar to those of FIG. 8. Here, the intrinsic delay is around 80 ps and the incremental delays are between 40 and 104 ps depending on the particular input drive condition. When the input drive is increased to at least 16:10, the incremental delay drops to 65 ps.

Figure 10:
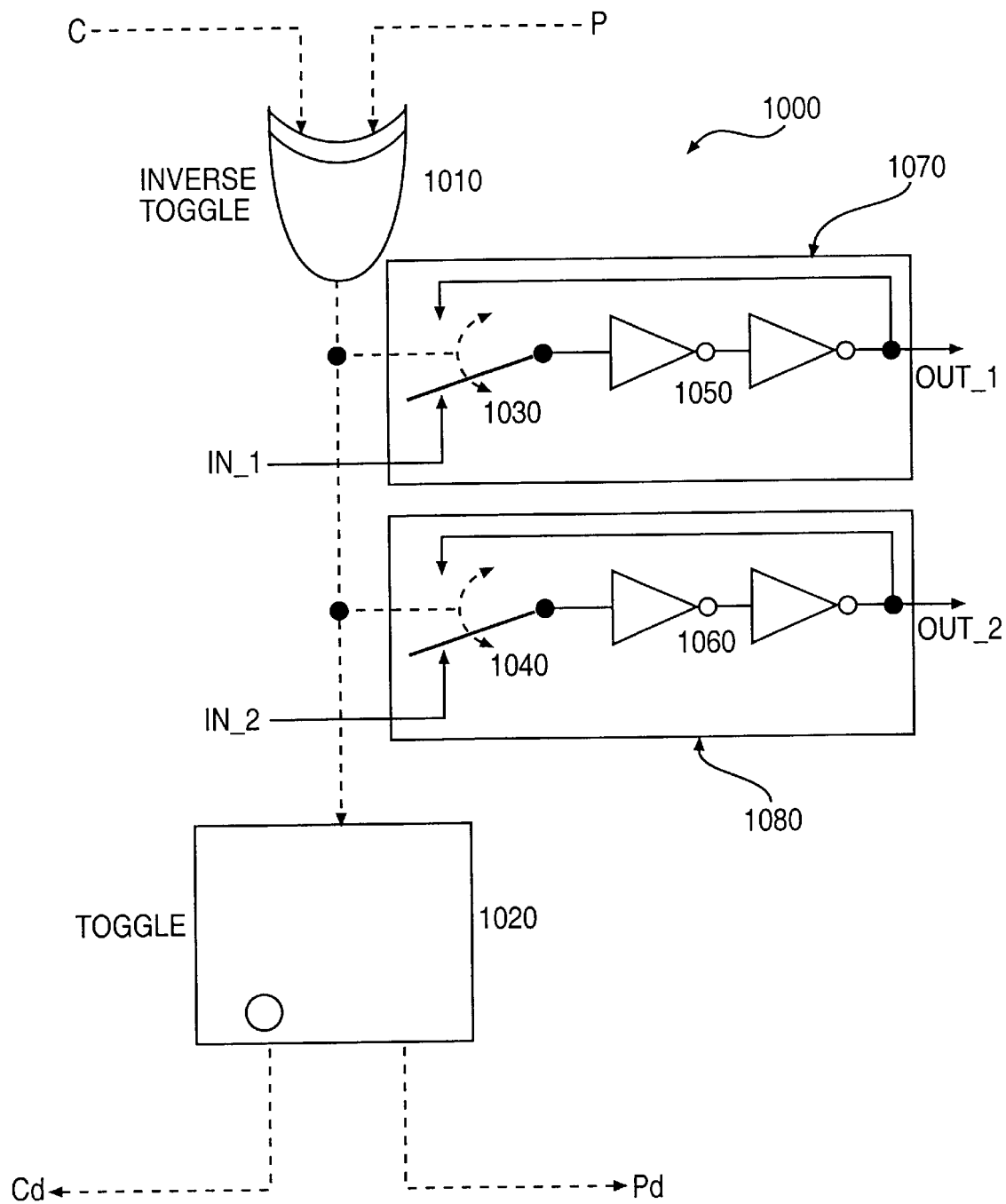
FIG. 10 is a logic circuit using an XOR gate according to the present invention.

FIG. 10 illustrates an event-controlled storage register 1000 using an Inverse Toggle 1010. In addition to Inverse Toggle 1010, register 1000 includes a Toggle 1020, two switches 1030 and 1040, and two pairs of inverters 1050 and 1060. Switch 1030 and inverter pair 1050 form a latch 1070, and switch 1040 and inverter pair 1060 for a latch 1070. Inverter pairs 1050 and 1060 serve as amplifiers to help drive the transistors of the register 1000. Register 1000 further includes two control inputs C and P, two data inputs IN_1 and IN_2, two control outputs Cd and Pd, and two data outputs OUT_1 and OUT_2. Control input C represents a capture event, and control input P represents a pass event. Control outputs Cd and Pd represent completion of the capture and pass events, respectively. Although only two data inputs and outputs are shown, any number of data bits could be used depending on the storage requirement of register 1000.

Inverse Toggle 1010 receives control inputs C and P. The output of Inverse Toggle 1010 is an input to Toggle 1020 which produces the control outputs Cd and Pd. The output of Inverse Toggle 1010 is also coupled to latches 1070 and 1080 to set the position of switches 1030 and 1040, respectively. Switches 1030 and 1040 are coupled to inverter pairs 1050 and 1060, respectively, where the inverters of each pair are connected in series. The output of the second inverter of each pair produces the data outputs OUT_1 and OUT_2. The switches 1030 and 1040 are also coupled to receive the data inputs IN_1 and IN_2, respectively.

The events at the control inputs alternate with the event at C happening first. Thus, control input C corresponds to the A input of FIG. 5, and control input P corresponds to the B input of FIG. 5. Before Inverse Toggle 1010 receives an event from C, the switches 1030 and 1040 of latches 1070 and 1080, respectively, are in the position as shown. This position shows the switches set in preparation for a capture event because the data at data inputs IN_1 and IN_2 are passed to the data outputs OUT_1 and OUT_2, respectively.

After an event at control input C, Inverse Toggle 1010 sends an output event to the switches 1030 and 1040, causing the switches to flip from the position shown and causing the latches to capture the data. The flipped switches form a loop that causes the data at data outputs OUT_1 and OUT_2 to circle back to the outputs. Thus, the data at each output is captured and held by Register 1000.

Toggle 1020 also receives the output event from Inverse Toggle 1010. The first event received by Toggle 1020 causes an event at the output with the dot. The next event causes an event at the other output. All succeeding events at the input alternately output events at the two outputs. Since the output event received by Toggle 1020 is the first event, the event is output to control output Cd, indicating completion of the "capture event".

After a capture event, Inverse Toggle 1010 receives an event from control input P. The output event from Inverse Toggle 1010 causes the switches 1030 and 1040 to revert to the positions shown. This reversion sets the switches back to a pass event, i.e., data from data inputs IN_1 and IN_2 passes to data outputs OUT_1 and OUT_2, respectively. Toggle 1020 also receives the output event from Inverse Toggle 1010 and outputs an event to control output Pd, indicating completion of the pass event.

Figure 11:
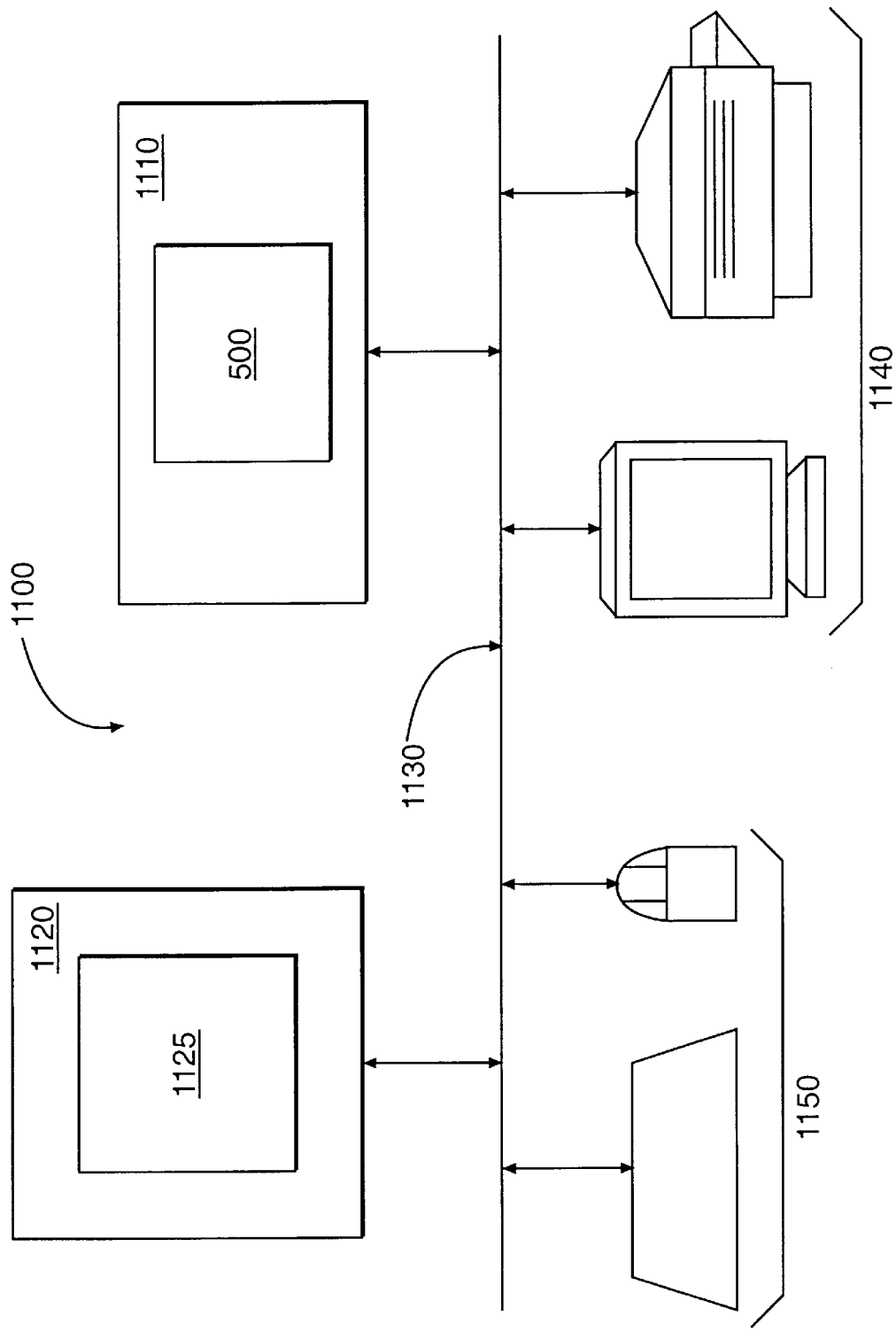
FIG. 11 is a diagram of a computer system including an XOR/XNOR gate according to the present invention.

The Inverse Toggle provides improved performance for an assortment of functions and devices as illustrated by event-controlled storage register 1000. Another example where the Inverse Toggle proves useful is in modern computer systems. Computer systems today are required to perform ever increasing numbers of operations in ever decreasing amounts of time. For example, computer system 1100 shown in FIG. 11 includes a processor 1110 and memory 1120 which is coupled to processor 1110 through a bus 1130. Processor 1110 fetches from memory 1120 computer instructions and executes the fetched computer instructions. Processor 1110 also reads data from and writes data to memory 1120 and sends data and control signals through bus 1130 to one or more computer display devices 1140. Processor 1110 additionally receives data and control signals through bus 1130 from one or more computer user input devices 1150 in accordance with fetched and executed computer instructions.

Memory 1120 can include any type of computer memory and can include, without limitation, randomly accessible memory (RAM), read-only memory (ROM), and storage devices which include storage media such as magnetic and/or optical disks. Memory 1120 includes computer process 1125 which executes within processor 1110 from memory 1120. A computer process is a collection of computer instructions and data which collectively define a task performed by computer system 1100.

Computer display devices 1140 can be any type of computer display device including without limitation a printer, a cathode ray tube (CRT), a light-emitting diode (LED) display, or a liquid crystal display (LCD). Each of computer display devices 1140 receives from processor 1110 control signals and data and, in response to such control signals, displays the received data. Computer display devices 1140, and the control thereof by the processor 1110, are conventional.

User input devices 1150 can be any type of user input device including, without limitation, a keyboard, a numeric keypad, or a pointing device such as an electronic mouse, trackball, lightpen, touch-sensitive pad, digitizing tablet, thumb wheels, or joystick. Each of user input devices 1150 generates signals in response to physical manipulation by a user and transmits those signals through bus 1130 to processor 1110.

As described above, computer process 1125 executes within processor 1110 from memory 1120. Specifically, processor 1110 fetches computer instructions from computer process 1125 and executes those computer instructions. Computer process 1125 includes a number of computer instructions, execution of which causes logic circuit 500 which is described above in greater detail with respect to FIG. 5, which is included within processor 1110 as shown, to perform logical operations, in the manner described above. Accordingly, computer system 1100 is particularly efficient in executing computer process 1125. For example, if computer process 1125 performs event-logic processing, processor 1110, and therefore logic circuit 500, may perform several operations for each event. As a result, the efficiencies described above with respect to logic circuits 500, 400 (FIG. 4), and 200 (FIG. 2) according to the principles of the present invention realize substantial performance improvements when employed in computer systems such as computer system 1100.

CONCLUSION

The logic gate according to this invention therefore takes advantage of the situation where the order of inputs is known and the inputs alternate. By doing so, the logic gate reduces delay, both incremental and intrinsic, and reduces the number of transistors.

It will be apparent to those skilled in the art that various modifications and variations can be made to disclosed embodiments of the present invention without departing from the scope or spirit of the invention. Other embodiments of the invention will be apparent to those skilled in the art from consideration of the specification and practice of the embodiments of the invention disclosed herein. The specification and examples should be considered exemplary, with the true scope and spirit of the invention being indicated by the following claims and their full range of equivalents.

What is claimed is:

1. A logic gate for producing a first output logic signal representing a logical operation of a first logic signal and a second logic signal, the logic gate comprising:

a first input terminal receiving the first logic signal;

a second input terminal receiving the second logic signal;

a third input terminal receiving a first inverted logic signal representing the logical inverse of the first logic signal;

a fourth input terminal for receiving a second inverted logic signal representing the logical inverse of the second logic signal;

a non-inverting stage including
   a first transistor of a first type having a first channel coupled at a first end to the first input terminal and having a first gate coupled to the fourth input terminal, and
   a second transistor of a second type, different from the first type, having a second channel coupled between a second end of the first channel and the second input terminal, and having a second gate coupled to the first input terminal;

an inverting stage including
   a third transistor of the first type having a third channel coupled at a first end to the third input terminal and a third gate coupled to the second input terminal, and
   a fourth transistor of the second type having a fourth channel coupled between a second end of the third channel and the fourth input terminal, and having a fourth gate coupled to the third input terminal; and a first output terminal coupled to the junction of the first and second channels and to the junction of the third and fourth channels, for providing the first output logic signal.

2. A logic gate according to claim 1, wherein said first and third transistors are N-type transistors;

said second and fourth transistors are P-type transistors; and the first output logic signal represents an exclusive OR operation of the first and second logic signals.

3. A logic gate according to claim 1, wherein said first and third transistors are P-type transistors;

said second and fourth transistors are N-type transistors; and the first output logic signal represents an exclusive NOR operation of the first and second logic signals.

4. A logic gate according to claim 1, further comprising:

a second non-inverting stage including
   a fifth transistor of the second type having a fifth channel coupled at a first end to the first input terminal and having a fifth gate coupled to the fourth input terminal, and
   a sixth transistor of the first type, different from the first type, having a sixth channel coupled between a second end of the fifth channel and the second input terminal, and having a sixth gate coupled to the first input terminal;

a second inverting stage including
   a seventh transistor of the second type having a seventh channel coupled at a first end to the third input terminal and a seventh gate coupled to the second input terminal, and
   an eighth transistor of the first type having an eighth channel coupled between a second end of the seventh channel and the fourth input terminal, and having an eighth gate coupled to the third input terminal; and a second output terminal, coupled to the junction of the fifth and sixth channels and to the junction of the seventh and eighth channels, for providing a second output logic signal.

5. The logic gate according to claim 4, wherein the first, third, sixth, and eighth transistors are N-type transistors;

the second, fourth, fifth, and seventh transistors are P-type transistors;

the first output logic signal represents an exclusive OR operation of the first and second logic signals; and the second output logic signal represents an exclusive NOR operation of the first and second logic signals.

6. The logic gate according to claim 4, wherein the first, third, sixth, and eighth transistors are P-type transistors;

the second, fourth, fifth, and seventh transistors are N-type transistors;

the first output logic signal represents an exclusive NOR operation of the first and second logic signals; and the second output logic signal represents an exclusive OR operation of the first and second logic signals.

7. A computer system comprising:

a memory;

one or more user input devices;

one or more output devices; and a processor which is operatively coupled to the memory, the user input devices, and the output devices and which includes a logic gate for producing a first output logic signal representing a logical operation of a first logic signal and a second logic signal, the logic gate including a first input terminal receiving the first logic signal;

a second input terminal receiving the second logic signal;

a third input terminal receiving a first inverted logic signal representing the logical inverse of the first logic signal;

a fourth input terminal receiving a second inverted logic signal representing the logical inverse of the second logic signal;

a non-inverting stage including a first transistor of a first type having a first channel coupled at a first end to the first input terminal and having a first gate coupled to the fourth input terminal, and a second transistor of a second type, different from the first type, having a second channel coupled between a second end of the first channel and the second input terminal, and having a second gate coupled to the first input terminal;

an inverting stage including a third transistor of the first type having a third channel coupled at a first end to the third input terminal and a third gate coupled to the second input terminal, and a fourth transistor of the second type having a fourth channel coupled between a second end of the third channel and the fourth input terminal, and having a fourth gate coupled to the third input terminal; and a first output terminal coupled to the junction of the first and second channels and to the junction of the third and fourth channels, for providing the first output logic signal; and a plurality of logic elements coupled to the first, second, third, and fourth input terminals and the first output terminal of the logic gate.

8. A computer system according to claim 7, wherein said first and third transistors of the logic gate are N-type transistors;

said second and fourth transistors of the logic gate are P-type transistors; and the first output logic signal represents an exclusive OR operation of the first and second logic signals.

9. A computer system according to claim 7, wherein said first and third transistors of the logic gate are P-type transistors;

said second and fourth transistors of the logic gate are N-type transistors; and the first output logic signal represents an exclusive NOR operation of the first and second logic signals.

10. A computer system according to claim 7, the logic gate further including a second non-inverting stage including a fifth transistor of the second type having a fifth channel coupled at a first end to the first input terminal and having a fifth gate coupled to the fourth input terminal, and a sixth transistor of the first type, different from the first type, having a sixth channel coupled between a second end of fifth the channel and the second input terminal, and having a sixth gate coupled to the first input terminal;

a second inverting stage including a seventh transistor of the second type having a seventh channel coupled at a first end to the third input terminal and a seventh gate coupled to the second input terminal, and an eighth transistor of the first type having an eighth channel coupled between a second end of the seventh channel and the fourth input terminal, and having an eighth gate coupled to the third input terminal; and a second output terminal, coupled to the junction of the fifth and sixth channels and to the junction of the seventh and eighth channels, for providing a second output logic signal; and the plurality of logic elements further coupled to the fifth, sixth, seventh, and eighth input terminals and the first and second output terminals of the logic gate.

11. A method for operating a logic gate having a first input terminal receiving a first logic signal, a second input terminal receiving a second logic signal, a third input terminal receiving a logical inverse of the first logic signal, a fourth input terminal receiving a logical inverse of the second logic signal a non-inverting stage connected between the first and second input terminals and including a first transistor of a first type connected in series with a second transistor of a second type, a gate of the first transistor being coupled to the fourth input terminal, and a gate of the second transistor being coupled to the first input terminal, an inverting stage connected between the third and fourth input terminals and including a third transistor of the first type connected in series with a fourth transistor of the second type, a gate of the third transistor being coupled to the second input terminal, and a gate of the fourth transistor being coupled to the third input terminal, and a first output terminal coupled to the junction of the first and second transistors and to the junction of the third and fourth transistors, the method comprising the steps of:

driving the first output terminal to a first state when the first logic signal and second logic signal are both at the same state; and driving the first output terminal to a state that is the inverse of the first state when the first logic signal is at a different state from the second logic signal.

12. The method according to claim 11, wherein the first and third transistors are P-type transistors and the second and fourth transistors are N-type transistors, and wherein the method includes the steps of receiving the first and second logic signals as both positive logic signals such that the method produces an exclusive OR operation of the first and second logic signals.

13. The method according to claim 11, wherein the first and third transistors are N-type transistors and the second and fourth transistors are P-type transistors; and wherein the method includes the steps of receiving the first logic signal as a positive logic signal and the second logic signal as a negative logic signal such that the method produces an exclusive NOR operation of the first and second logic signals.

* * * * *

UNITED STATES PATENT AND TRADEMARK OFFICE
CERTIFICATE OF CORRECTION

PATENT NO.  : 5,861,762
DATED       : January 19, 1999
INVENTOR(S) : Ivan E. Sutherland It is certified that error appears in the above-indentified patent and that said Letters Patent is hereby corrected as shown below:

In Claim 10, Column 12, Line 27, please change "fifth the channel" to -- the fifth channel --.

Signed and Sealed this

Eighth Day of June, 1999

Attest:

Q. TODD DICKINSON

Attesting Officer

Acting Commissioner of Patents and Trademarks